United States Patent [19]

Scheingold et al.

[11] 4,220,383
[45] Sep. 2, 1980

[54] SURFACE TO SURFACE CONNECTOR

[75] Inventors: William S. Scheingold, Palmyra; Frank C. Youngfleish, Harrisburg, both of Pa.

[73] Assignee: AMP Incorporated, Harrisburg, Pa.

[21] Appl. No.: 27,567

[22] Filed: Apr. 6, 1979

Related U.S. Application Data

[63] Continuation-in-part of Ser. No. 971,629, Dec. 20, 1978, abandoned, which is a continuation of Ser. No. 851,338, Nov. 14, 1977, abandoned.

[51] Int. Cl.$^2$ .............................................. H05K 1/12
[52] U.S. Cl. .............................................. 339/17 CF
[58] Field of Search ....... 339/17 CF, 75 MP, 176 MP

[56] References Cited

U.S. PATENT DOCUMENTS

| | | | |
|---|---|---|---|
| 3,663,920 | 5/1972 | Lapham et al. | 339/17 CF |
| 3,771,109 | 11/1973 | Bruckner et al. | 339/17 CF |
| 3,877,064 | 4/1975 | Scheingold et al. | 339/17 CF |
| 3,942,854 | 3/1976 | Klein et al. | 339/17 CF |

Primary Examiner—Neil Abrams
Attorney, Agent, or Firm—Allan B. Osborne

[57] ABSTRACT

The present invention relates to a connector for connecting a semi-conductor chip carrier to a printed circuit board (PCB). More particularly, the invention comprises an insulating housing and a plurality of contact-bearing spring members positioned around the periphery of a central compartment in the housing. The spring member connects the leads on the chip package to traces on the PCB.

1 Claim, 4 Drawing Figures

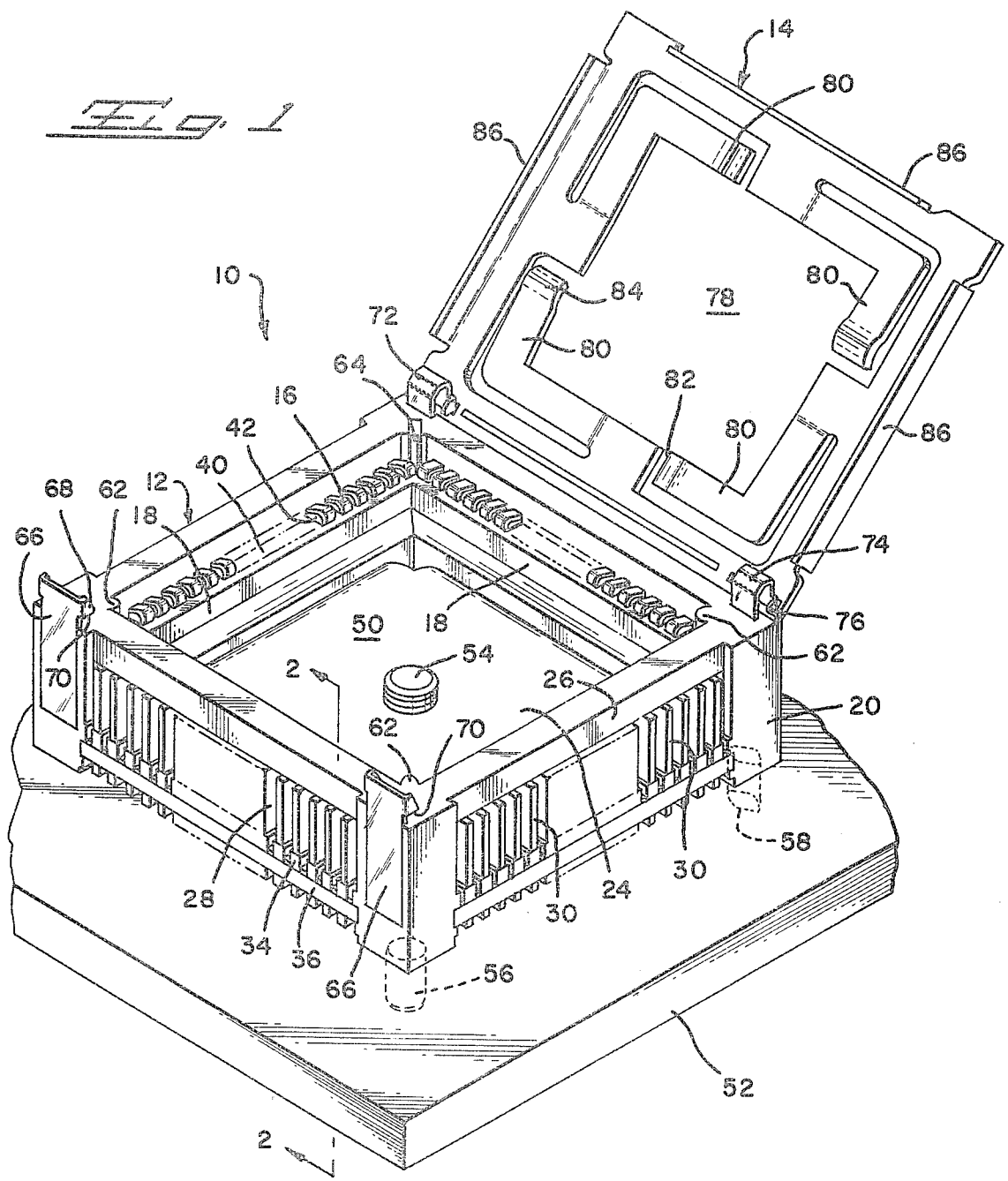

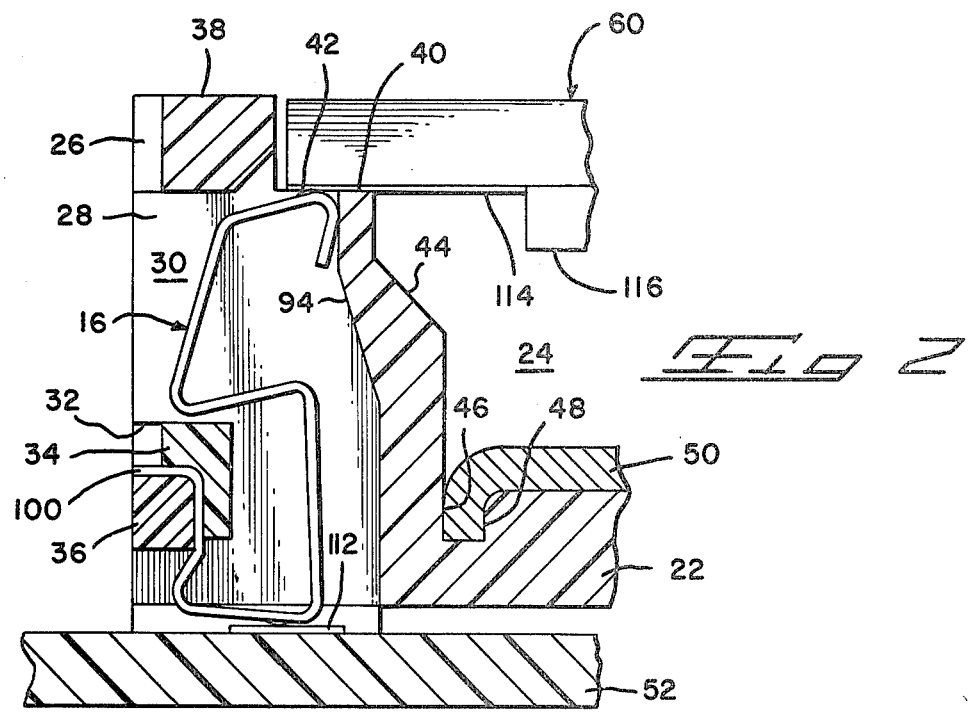
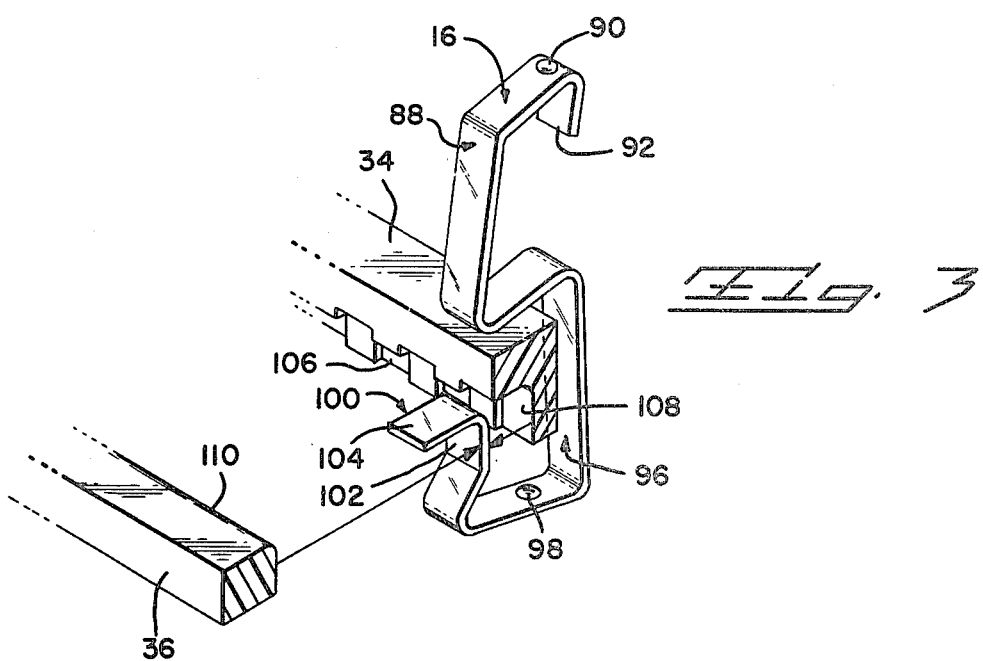

SURFACE TO SURFACE CONNECTOR

RELATED APPLICATIONS

This is a continuation-in-part application of U.S. application, Ser. No. 971,629, filed Dec. 20, 1978, now abandoned, which is a continuation of U.S. application, Ser. No. 851,338, filed Nov. 14, 1977, now abandoned.

BACKGROUND OF THE INVENTION

1. Field of the Invention

This invention relates to a device for housing a chip-carrying package and connecting the package to a PCB.

2. Prior Art

Representative prior art include U.S. Pat. Nos. 3,877,064 and 3,940,786, the latter being a CIP of the former. The teachings of both patents relate to surface to surface connectors for connecting leadless integrated circuit packages to a PCB. The connectors include a housing of insulating material having a central compartment. A number of contact-carrying conductive spring members are positioned about the perimeter of the compartment. A chip-carrying package is placed in the compartment with the contacts on the upper portion of the spring members contacting the electrically conductive pads on the package. The contacts on the lower portion of the spring members contact the traces on the PCB to complete the electrical path from the clip.

SUMMARY OF THE PRESENT INVENTION

Various electronic instruments, such as computers and the like, require structurally different devices for connecting semi-conductor chip packages to a PCB. In addition to the housing and package geometry, other characteristics which often require many days and months of experimental work include spring member force-deflection capability, contact reliability with respect to mechanical and thermal shock, vibration, corrosion, chip package cooling and inductance effects.

The present invention provides a housing of insulating material, a cover having integral biasing means, packaging centering means and S-shaped contact carrying spring members positioned in the housing around a package-receiving, central compartment.

BRIEF DESCRIPTION OF THE DRAWINGS

FIG. 1 is a perspective view of the preferred embodiment of the present invention;

FIG. 2 is a cross-sectional view of the preferred embodiment taken along lines 2—2 of FIG. 1;

FIG. 3 is a view depicting one method of securing the spring members in the housing.

DESCRIPTION OF THE INVENTION

Figure 4:
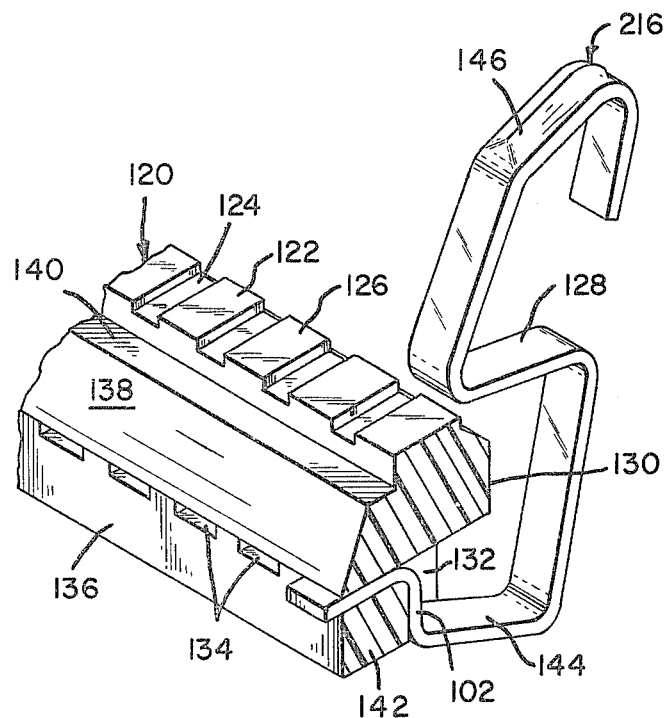
FIG. 4 is a view depicting another method of securing the spring members in the housing.

Surface to surface connector 10, constructed in accordance with the present invention, is illustrated perspective in FIG. 1.

Its components or parts include the square frame 12, cover 14 and spring members 16.

Frame 12 consists of four side walls 18 integrally joined by corner posts 20 and a floor 22 which can be seen in FIG. 2. The walls and floor define a upwardly opened, package-receiving compartment 24.

The outside vertical surfaces of the side walls are characterized by a recess 26 extending across the upper portion and a plurality of vertically elongated cells 28 extending along the length of each wall between the corner posts. The cells extend downwardly from the recess through the base of each wall as shown clearly in FIG. 2. The vertical sections of the walls between the cells, hereinafter referred to as partitions 30, are notched near the lower ends. These notches, designated by reference numeral 32, receive inner and outer retaining members 34 and 36 respectively.

Top surface 38 of the side walls are flat.

The interior vertical surfaces of side walls 18 include a horizontal ledge 40 located just below the top surface. The ledge extends completely around the perimeter of compartment 24. A plurality of windows 42 are positioned through the ledge to give access to each cell 28. The wall below the ledge has a beveled portion 44 inbetween two vertical sections. The beveled portion represents increasing wall thickness while also providing greater cell depth.

The junction between walls 18 and floor 22 is represented by groove 46. This groove receives the downturned edges 48 of a metal plate 50. Plate 50 provides means for attaching connector 10 to PCB 52 by means of bolt 54 extending through the PCB and threadably received by the plate as shown in FIG. 1.

As chip orientation is a critical necessity and always difficult due to size, orientation features must be present. So that the connector may be properly orientated on the PCB, pegs of various geometric configurations are provided in the bases of corner posts 20. As seen in FIG. 1, one corner post has a cylindrical peg 56 and another corner post has a diamond-shaped peg 58. The three elements consisting of the two corner pegs and clamping screw serve to orient the connection on the P.C. board. In addition, alignment of the lower dimple 98, with respect to contact pad 112 of the P.C. board is critical. The requirement is met by having a round peg fit closely into a round hole which becomes the zero reference point for the pad. The diamond shaped pin engages another corresponding hole in the P.C. board. The large diameter of the diamond pin fits closely into the mating hole and rotational stability and alignment is achieved. The combination of a round peg and a diamond-shaped peg allows a reasonable tolerance or distance between pegs and between holes without loss of locational and alignment accuracy.

Orientation of the chip-carrying package 60 (partially shown in FIG. 2) in connector 10 is accomplished by providing protuberances 62 at three of the four interior corners. Three of the four edges (not shown) of the package have complementary recesses to receive the protuberances. The fourth interior corner of the package has a thruster clip 64 which cams package 60 against the other three corners so as to provide lateral restraint thereof. The biasing force of the thruster clip is a preloaded cantilever arm. Other conventional biasing means may also be used.

Two corner posts carry means to latch cover 14. These latches, indicated by reference numeral 66, are of resilient material and have a pair of ears 68 which provide downwardly facing shoulders 70. The ears are beveled so that the cover, in being closed over the frame 12, cams the latches out of the way. Once the cover is past, the latches rebound with the shoulders on top of the cover holding it in place.

The corner posts opposite the latches carry hinge means 72. These hinges have a U-shaped portion 74 with inwardly projecting ears 76 on the outside or free leg. The hinge loop 74 is designed to allow cover 14 to be pivoted until it is parallel to the substrate before spring fingers 84 contact package 60. The cover is thrust vertically downward until latches 66 are engaged simultaneously on all four corners. This procedure allows simultaneous loading of the four spring fingers 80 on package 60. Since package 60 is very often fabricated from ceramic, which is a brittle material and is relatively weak in tension and bending, it is important to avoid unequal loads.

Cover 14 has a central opening 78 and four hold down springs 80 symmetrically disposed about the opening. Each spring is L-shaped with the free end 82 having an upset portion as indicated by reference numeral 84.

A flap 86 depends from four sides of the cover acting as stiffeners. These flaps are received in recesses 26 when the cover is closed onto the frame.

Preferably the frame is molded from thermoplastic polyester, a plastic material marketed by General Electric Company under the tradename of Valor.

The cover 80 is made from high carbon steel, heat-treated to a spring temper.

Spring members 16 generally resemble a squarish letter "S". The upper portion 88 has a coined and dimpled area which provides the upper contact 90. The free end 92 is turned down and in to provide a smooth rubbing surface against the inner wall 94 of the cell.

The lower portion 96 carries the lower contact 98 formed by placing an outwardly projecting dimple in the horizontal section.

The free end of the lower portion is formed into a tail 100. The tail is L-shaped with a short vertical section 102 and a short horizontal section 104.

Preferably the spring members are stamped and formed from a coplanar strip of berylium copper alloy. They may be heat-treated and plated with gold over nickel, or tin-lead.

Retaining members 34 have a generally concave section 106 extending along the length thereof. The surface of the concave section has slots 108 spaced at intervals corresponding to cell intervals along the sides of the frame.

Retaining members 36 have a rounded edge 110. Retaining members 34 and 36 are assembled to a strip of spring members 16 equal to the number of cells 28 per side.

The spring members 16 are loaded into cells 28 so that the upper contacts 90 are pushing up through windows 42 and tails 100 pointing outwardly, as shown in FIG. 2. One or both retaining members may be fixed to the frame by an adhesive, ultrasonic welding or by an interference fit.

Connector 10 may be secured to a PCB via bolt 54. The lower contacts 98, which extend slightly below the base of the frame, engage circuit paths 112 on the board.

Upon placing package 60 in the frame, the circuit traces 114 thereon engage the spring members upper contacts 90. The encapsulated chip 116 extends down in the frame's compartment 24.

Contact pressure on the spring members is maintined by hold down springs 80 on cover 14. The central opening 78 in the cover provides access to the chip for cooling.

As FIG. 2 shows, a portion of tail 100 is testing probe accessible in that retaining number 34 is set back in notches 32.

With reference now to FIG. 4, another method to retain spring members 216 in the housing is shown. The method employs a one piece retaining member indicated generally by reference numeral 120. Each member or retaining means, is an elongated bar having a complex shape of steps, grooves, bevels and openings.

The very upper or top surface 122 has a series of grooves 124 cutting across the surface normal to the bar's long axis. The grooves receive the upper wall of notches 32.

The lower half of inwardly facing wall 130 has a series of niches 132 corresponding in number and spacing to the cells. Openings 134 extend from the rear wall of the niches to outwardly facing wall 136.

The outwardly facing wall, above the openings, is beveled inwardly as shown by reference numeral 138. A step 140 leads up to the upper or top surface 120. The base 142 of the bar is flat across.

As shown in FIG. 4, spring members 216 are loaded into retaining means 120 by inserting tails 100 through openings 134. The vertical sections 102 bears against the back wall of niches 132.

As will be noticed, spring member 16 shown in FIGS. 1 through 3 has been changed structurally to accommodate retaining means 120.

The changes include the direct attachment of tail 100 to the spring section which carries lower contact 98. This section is designated by reference numeral 144.

Upper portion 88 has been altered by increasing the contact from a dimple, reference numeral 90, to an elongated triangular shaped contact, indicated generally by reference numeral 146. Whereas this particular change does not relate to retaining means 120, the enlarged contact area facilitates manufacture.

The foregoing detailed description has been given for clearness of understanding only, and no unnecessary limitations should be understood therefrom, as some modifications will be obvious to those skilled in the art.

What is claimed is:

1. An electrical connector for connecting a semi-conductor chip carrier or the like to a printed circuit board, comprising:
   a. a frame of insulating material having four sidewalls with each sidewall having a plurality of vertically extending cells opening outwardly and downwardly with each cell having a window opening upwardly, and an outwardly opening recess in and extending along the length of each sidewall, said sidewalls defining a central compartment;
   b. a plurality of conductive spring members being generally S-shaped with contacts being provided on an upper portion and lower portion and having a tail section extending from the lower portion and comprising a vertical and horizontal section, said spring members being positioned in the cells with the upper portion contact pushing out through the window, the lower portion contact depending below the frame for biasing positioning on circuits on the printed circuit board and said tail section extending into the recess;
   c. retaining means for retaining the spring members in the cells, said means including elongated first members having a concave portion along one edge with a plurality of slots spaced along and in the concave portion, said first member being positioned against the back of the recess with the inside surface of the tail sections being received in the slots, said means further including elongated second members having a convex edge being positioned in the recessed with the convex edge bearing against the outside surface of the tail sections; and d. a cover hinged to the frame, said cover having spring means thereon so that upon placing a semiconductor chip carrier into the central compartment and closing the cover, the spring means bias the carrier downwardly against the spring member contacts in the windows.

* * * * *